United States Patent [19]

Goto

[11] Patent Number: 4,647,714

[45] Date of Patent: Mar. 3, 1987

[54] COMPOSITE SHEET MATERIAL FOR MAGNETIC AND ELECTRONIC SHIELDING AND PRODUCT OBTAINED THEREFROM

[75] Inventor: Hideo Goto, Atsugi, Japan

[73] Assignees: Showa Laminate Printing Co., Ltd., Kanagawa; J & M Co., Ltd., Aichi, both of Japan

[21] Appl. No.: 687,557

[22] Filed: Dec. 28, 1984

[51] Int. Cl.$^4$ .................... H01B 7/34; H05K 9/00
[52] U.S. Cl. ................... 174/36; 174/35 R; 174/35 MS; 206/328; 229/3.5 MF; 428/681
[58] Field of Search ............... 174/36, 35 MS, 35 R, 174/117 FF; 428/607, 681, 935; 206/328, 524.3, 524.4; 229/3.5 MF

[56] References Cited

U.S. PATENT DOCUMENTS

| | | | |
|---|---|---|---|
| 1,144,106 | 6/1915 | Burgess | 428/681 X |
| 1,562,711 | 11/1925 | Madsen | 428/607 X |
| 2,690,199 | 9/1954 | Bennorth | 229/3.5 MF |
| 3,305,323 | 2/1967 | Smith et al. | 428/607 |
| 3,332,860 | 7/1967 | Diebold et al. | 174/35 MS X |
| 3,341,102 | 9/1967 | Stephens et al. | 174/35 MS |
| 3,355,265 | 11/1967 | Hudson | 428/607 |
| 3,436,467 | 4/1969 | Smith, Jr. | 174/35 MS |
| 3,438,754 | 4/1969 | Shepard et al. | 428/935 |
| 3,512,946 | 5/1970 | Hutkin | 428/935 X |
| 3,522,154 | 7/1970 | Swalheim | 428/935 X |
| 3,997,301 | 12/1976 | Yoshihara et al. | 428/935 X |
| 4,157,757 | 6/1979 | Gallaher, Jr. | 206/328 |
| 4,219,928 | 9/1980 | Kuo | 174/117 FF X |
| 4,331,285 | 5/1982 | Gottwals | 174/35 R X |
| 4,468,089 | 8/1984 | Brorein | 174/36 X |
| 4,481,379 | 11/1984 | Bolick, Jr. et al. | 174/36 |
| 4,482,048 | 11/1984 | Blodgett | 206/328 |
| 4,514,586 | 4/1985 | Waggoner | 174/35 MS |
| 4,528,222 | 7/1985 | Rzepecki et al. | 206/328 X |
| 4,533,784 | 8/1985 | Olyphant, Jr. | 174/36 |

FOREIGN PATENT DOCUMENTS 398348 1/1974 U.S.S.R. ................ 428/607

OTHER PUBLICATIONS

Electronic Equipment; Flexible Magnetic Shielding Foil Cuts Production Costs; Jun. 1957, p. 21.

*Primary Examiner*—Arthur T. Grimley
*Assistant Examiner*—Morris H. Nimmo
*Attorney, Agent, or Firm*—Browdy and Neimark

[57] ABSTRACT

Composite sheet material, used for shielding magnetism and electromagnetic waves, principally made of an electrodeposited iron foil, as the core, with a thickness of at least 10 μm which is applied on either side surface thereof a plating layer with a respectively predetermined metal, and of, a covering layer which is formed of a suitable sheet-like material and which is to be laminated on at least one of the two plating layers through the medium of an adhesive layer. A variety of products utilizing this composite sheet material as an essential elements thereof which stretches over a wide field wherein magnetic and electronic shield is required, for example: magnetic-card holders; magnetic-card protection cases or boxes; envelopes and containers for keeping and transporting magnetic recording media; wallpapers for various special rooms, etc.

15 Claims, 28 Drawing Figures

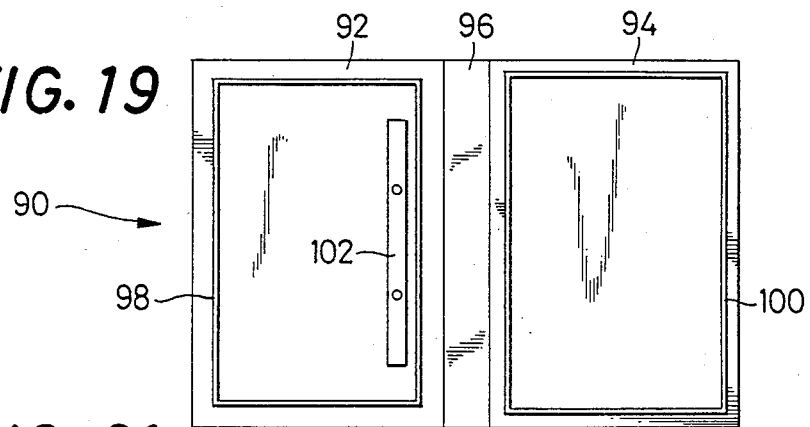
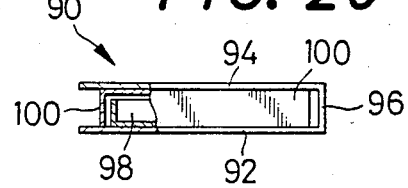
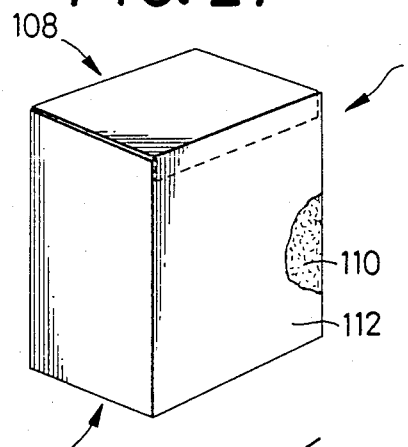
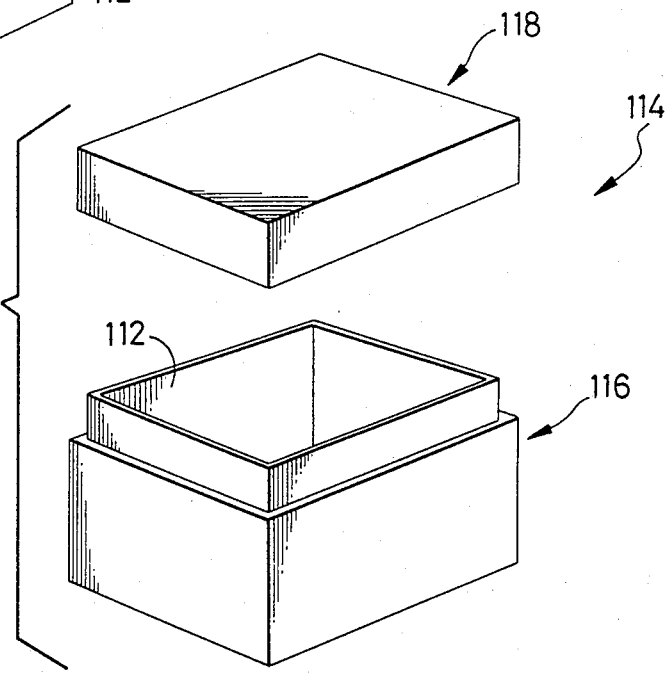

COMPOSITE SHEET MATERIAL FOR MAGNETIC AND ELECTRONIC SHIELDING AND PRODUCT OBTAINED THEREFROM

BACKGROUND OF THE INVENTION

The present invention relates to composite sheet materials for magnetic and electronic shielding, and products obtained therefrom such as envelopes and boxes used for transporting magnetic recording medium (media) and/or electronic parts or component(s), protection cases for magnetic cards, storage files for magnetic recording medium (media), covers for electric wires, wallpaper or wall-decorative materials, adhesive tapes, etc.

Following the commercial development of audio-articles, information recording media for music, images or voices have been recently developed as software for the aforementioned articles. It has brought about, in addition to the traditional use of records and audio-tapes, a wide use of video-tapes, video-discs and laser discs.

Triggered by the practical use of VLSI (Very Large Scale Integration), miniaturization of computers, such as microcomputers, personal computers, etc., has greatly progressed, and propagation of computers, both office use and household use, has been also promoted. This situation is gradually causing replacement of floppy discs for the traditonal information recording media, for example, magnetic drums, magnetic discs, magnetic tapes for recording characters, letters, numerals, signs, symbols, drawings and so on.

Such rapid progress of the electronics industry is bringing about a new problem which is related to various disturbances caused by electromagnetic waves or magnetism.

For example, when electromagnetic waves or magnetism emitted from a computer or its related instruments directly hit the essential part of other computers, operation of the hit computer is hindered; and when a floppy disc as a memory of the magnetic disc is affected by magnetism, the stored information is disturbed and even rendered useless. Against such a background, the demand for materials for shielding against the effects of electromagnetic waves and magnetism is rapidly increasing.

Now, floppy discs, laser discs, audio-tapes, video-tapes, etc., are becoming popular not only in offices but also in households, and various problems have arisen as to their preservation and transportation. Envelopes in which such articles are conventionally placed subsequent to manufacture are unsuitable for packaging and transportation. With envelopes of this kind, it has been found that articles so packaged are broken during transportation by inappropriate handling. In addition, a new problem observed at present is that recorded information is erased or disappears when it is subjected to magnetic fields in the course of transportation.

Electronic parts or components used in computers, or in electronic instruments such as measures, are more and more miniaturized and lightened, on one hand, and more readily incorporated in the ever increasing electronic instruments on the other hand. Speedy transportation of those electronic parts, as essential parts for the electronic instruments, to their desired location is very desirable. Those electronic parts are susceptible to damage or destruction due to static electricity encountered during the transportation thereof.

Whether such electronic instruments, or electronic parts used therein, are boxed or installed in a room, there arises a need for shielding electronic noise emitted from those electronic instruments or electronic parts, as well as for shielding against the ingress of electronic noise into the box or the room. A similar need exists for shielding electronic noises emitted from wires of power sources for those electronic instruments and from wires connecting those electronic instruments with related devices. The influence of electronic noise in those wires must be also avoided.

Magnetic cards are at the moment widely utilized as cash cards an also as credit cards, and are usually carried by the owner in a holder. When an owner turns on a television set or stereo after having inserted the holder, magnetic lines emitted from the television set or the stereo may seriously affect the memory stored in those cards kept in the holder. Sometimes those cards become unusable.

Studies and experiments conducted in the past suggest various suitable materials for excluding or shielding electronic noise such as electromagnetic interference, static electricity interference, and radio frequency interference, for example, (1) a plastic housing thermally sprayed with metallic zinc; (2) a plastic housing coated with conductive paint; (3) a plastic housing to which is applied wet metallizing such as via chemical (electroless) plating or electro-plating; (4) a plastic housing to which is applied dry plating such as via vacuum evaporation, ion plating and spattering; and (5) plastics formed by mixing with electroconductive fiber such as fibrous metal and carbon fibers, or metal flakes such as aluminum flakes and nickel flakes. All of those materials have, however, proven unsatisfactory for a variety of reasons, as for example, some were limited in their use, some were difficult to be manufactured, or required oversized and expensive machinery in manufacturing, and some others were not satisfactory because of their insufficient shielding effect.

There have been other attempts to find suitable materials which can be seen in this field. Most of the materials found or tried are made of plastics laminated with metal foil(s) or metal sheet(s), for example, aluminum foil(s). Sufficient shielding effects cannot, however be expected from those laminated articles, particularly the magnetic shielding effect.

SUMMARY OF THE INVENTION

The present invention was made against such a background. The main object of this invention is therefore to provide a composite sheet material for magnetic shielding and electronic shielding such as electromagnetic shielding and electrostatic shielding, and products obtained therefrom.

Another object of this invention is to provide a corrugated packaging material for magnetic and electronic shielding and products obtained therefrom.

Still another object of this invention is to specifically provide envelopes and boxes, used for transporting magnetic recording media and/or electronic parts, protection cases for magnetic cards, storage files for magnetic recording media, covers for electric wires, wallpapers, adhesive tapes, etc., which exhibit excellent magnetic and electronic shielding properties.

A composite sheet material prepared according to this invention, in order to accomplish those objects, is characterized in comprising (i) a composite sheet metal made of an electrodeposited iron foil of at least 10 μm thickness with a plated layer of a predetermined metal, respectively on either side of the foil, and (ii) a covering layer formed by adhesively laminating at least one suitable sheet-like material through the medium of an adhesive layer, on at least one side of the plated layer of the composite sheet metal.

The electrodeposited iron foil which is used in this invention is, as is well known, a thin sheet made of a ferrous solution through the process of electrodeposition. More specifically, it is obtained by means of making iron in an electrolytic solution including ferrous ion deposit onto an electrodeposition body as a cathode, for example a rotating electrodeposition drum, at a predetermined thickness, and thereafter carefully exfoliating the electrodeposited iron layer from the drum. The electrodeposited iron foil obtained through such a process generally consists of high purity iron of not less than 99.97% purity, which is, irrespective of its being an extremely thin foil, very high in magnetic permeability and excellent in adsorption of magnet shielding of electromagnetic waves, and magnetism shieldability. Since this kind of the electrodeposited iron foil is, in comparison with common steel sheet, higher in magnetic permeability, and allows lines of magnetic force to extend in the direction of the plane of the iron foil, its composite is favourably provided with a high preventive capability against the influence of magnetism from an ordinary magnet, being synergistically supported by attenuation effect due to the distance of total thickness of the composite. As the electrodeposited iron foil is also relatively high both in the electric conductivity and in magnetic permeability, it shows higher shielding effect against electromagnetic waves than electroconductive paints, electroconductive plastics, etc. Its composite thereby possesses an excellent shielding effect from electromagnetic waves, in a wide range from low frequency to high frequency waves.

This kind of electrodeposited iron foil must be used, in order to give sufficient magnetic permeability, at a thickness of 10 μm or more. Although the highest limit is, from the view of handling and commercial practicability, 50 μm or so, thickness of more than 50 μm are permissible. For example, an iron foil of as thick as 100 μm can be actually used.

An electrodeposited iron foil prepared in this way can be, in addition, advantageously applied a plating layer, on both sides thereof, which consists of a highly electrically conductive metal, such as zinc, tin, nickel, chromium or copper. This metallic plating layer is mainly used for its rust-preventive effect for the iron foil, and it contributes a great deal in preventing qualitative deterioration, and in enhancing durability, of the composite sheet material employing the iron foil in this invention and products obtained therefrom. In particular, formation of such a plating layer scarcely affects the electrodeposition surface of the iron foil, which has a coarse aventurine-like surface consisting of a large number of effective pyramid-shape crystals. The above-mentioned feature effectively improves, when the iron foil is made into a composite by being laminated with other sheet materials, the joining between them. The plating layer can be formed of various methods, such as electro-plating, electroless plating, etc. The most usual and preferably practised way is, among others, that of electro-plating. As to the thickness of the plating layer, appropriate selection is permissible within the range between 0.1 μm and 5 μm.

Such an electrodeposited iron foil may be, instead of the above-mentioned plating layer of good electro-conductive metal or further thereupon, applied as a plating layer of lead. By means of this lead plating layer it becomes possible to additionally give the obtained composite sheet material the capability of shielding radioactive rays. This lead plating layer, similar to the aforementioned plating of good electro-conductive metals, can be formed in various known plating processes, and its thickness generally falls within the range between 20 μm and 100 μm.

According to this invention, at least one sheet-like covering layer of suitable material is applied, in lamination by way of an adhesive layer, onto the composite sheet metal, which has been formed by applying a predetermined plating layer on both surfaces of the electrodeposited iron foil, in order to obtain the desired composite sheet material. The sheet-like material used for the covering layer can include materials such as paper, plastic sheet, etc., and depending on the use of the obtained composite sheet material, the sheet-like material may be a metal foil or film or a metal sheet. The covering layer is not limited to a single sheet, but may be a lamination composed of, by way of adhesive layer(s), plural sheet-like materials.

According to one aspect of this invention, the composite sheet material in this invention is respectively provided on both sides of the surfaces thereof with a predetermined covering layer, and possesses on one of the covering layers, a pressure sensitive adhesive layer and additionally thereupon a release liner, such as a sheet of released paper or separate paper, which are adhesively laminated. It is allowed in this case to employ flameproof paper or flame retardant plastic sheet material, such as the sheet-like material constituting the other covering layer.

According to another aspect of this invention, the composite sheet material in this invention is provided, on one side of the surface of the composite sheet metal, with a predetermined covering layer, and on the other side of the surface thereof, with a pressure sensitive adhesive layer and a release liner additionally adhered thereupon. It is also possible, in this case, to mix the highly electrically conductive metal material, in the form of powder, flake or fiber, for example as copper powder, in the pressure sensitive adhesive layer so as to make the other material stuck, by way of the adhesive layer, on the composite sheet metal electrically conductive with the composite sheet metal.

Incidentally, the composite sheet material in this invention having on one side surface thereof, either covered wholly or partially, such a pressure sensitive adhesive layer, can be advantageously formed into covers for electric wires, wallpapers (wall-decorative materials), or adhesive tapes, as will be later described. When the composite sheet material is used as wallpaper, it is preferable to ground the composite sheet metal lying in the composite sheet material.

Formation of a magnetic-card holder, as one of the products made of the composite sheet material according to this invention, is carried out as follows. Two superposable cover sheet members of rectangular shape are flexibly connected at one mutually corresponding side, and at least one magnetic-card accommodating pocket is disposed inside at least one of the two superposable cover sheet members, while either of the two cover sheet members is provided as a double wall structure, between which double walls the composite sheet material above described is so disposed respectively as to occupy the substantial part of the cover sheet member.

As a modification of the above-mentioned magnetic-card holder, a magnetic card protection case of bag shape for accommodating a predetermined magnetic-card is provided. This bag shaped protection case comprises a flat front wall and a flat back wall, respectively of rectangular shape so as to be superposed, wherein the two walls are connected at three peripheral sides thereof so that the remaining open side provides an opening for the magnetic-card. Either the front wall or the back wall is of double wall structure, between which double walls the aforementioned composite sheet material is so disposed respectively as to occupy the substantial part of the plane of the wall.

A variation of the magnetic-card protection case is also presented, wherein the front wall and the back wall of the case are respectively constituted of double plastic sheets, heat-fused or heat-sealed at the peripheral portion thereof so as to form a bag-shape. Between the double plastic sheets in the front wall and in the back wall, one composite sheet material of predetermined size is respectively disposed.

Another variation of the magnetic-card protection case is proposed, wherein both the front wall and the back wall are respectively formed by means of twice bending two superposed plastic sheets. One composite sheet material earlier mentioned is disposed in the twice folded manner between the two plastic sheets which integrally constitute the front wall and the back wall.

As an example of products obtained by using the composite sheet material according to this invention, a transportation envelope can be presented. It is made into a rectangular bag of predetermined size. The purpose of the envelope resides in accommodating magnetic recording media and/or electrical parts, and transporting the same.

A transportation box made of the composite sheet material is another example of the products. This box is of generally rectangular shape of predetermined size, comprising an accommodating box body and a covering lid, respectively made of the composite sheet material according to this invention. The box is also used for accommodating magnetic recording media and/or electronic parts in the accommodating box body and transporting the same.

As still another example of the products in this category, a storage file for conserving magnetic recording media can be cited. This is of course made of the composite sheet material according to this invention.

It is also possible to produce, by using the composite sheet material, an electrical conductor assembly for magnetic and electronic shielding. The assembly comprises (1) a plate-like electrical conductor body with such a structure that a plurality of respectively independent electrical conducting members are sandwiched between the insulating layers, (2) a composite sheet metal layer which is disposed in lamination at least on one side of the electrical conductor body, and provided with an electrodeposited iron foil, of at least 10 $\mu$m thickness, which is covered respectively on either side surface thereof with a plating layer of predetermined metal, and (3) a covering layer which is formed by adhesively laminating at least one sheet of a suitable sheet-like material onto the composite sheet metal layer by the medium of an adhesive layer.

The plating layer in the above-mentioned electrical conductor assembly is composed of a first plating layer constituted of a good electric conductive metal formed on the surface of the electrodeposited iron foil, and a second plating layer made of lead formed on the first plating layer.

The covering layer in the electrical conductor assembly is preferably made of electrical insulating plastic sheet or paper.

As one embodiment of this invention, a corrugated packaging material for magnetic and electronic shielding is proposed. In this case a corrugated medium layer is formed on one side surface of the composite sheet material, as a liner layer, and a covering layer is formed on the other side surface thereof by means of adhesively laminating at least one sheet of a suitable flat sheet-like material, through the medium of the predetermined adhesive layer.

A couple of products advantageously made of the corrugated packaging material will be introduced hereunder by way of example:

A transportation envelope made of the packaging material in the form of a rectangular bag of predetermined size, for accommodating thereinto magnetic recording media and/or electronic parts and transporting the same, wherein the rectangular bag is formed by means of bending double one sheet of plate-like packaging material as already mentioned; and A box for magnetic and electronic shielding, made from the packaging material, with the purpose of accommodating thereinto magnetic recording media and/or electronic parts.

BRIEF DESCRIPTION OF THE DRAWINGS

The foregoing and other objects, features and advantages of the present invention will be better understood from reading the following preferred embodiments taken in consideration with the accompanying drawings in which:

FIG. 19 is elevational views showing an example of a magnetic recording medium accommodating file according to this invention in its open status, and FIG. 20 is a bottom view (partially cut away) of the file of FIG. 19 when in its closed status;

FIGS. 21 and 22 are, respectively perspective views (partially cut away), and an exploded view of an electromagnetic shielding box;

DETAILED DESCRIPTION OF THE PREFERRED EMBODIMENTS

The fundamental structure of the composite sheet material of this invention, can be varied in many ways, as illustrated by FIGS. 1–8.

Figure 1:
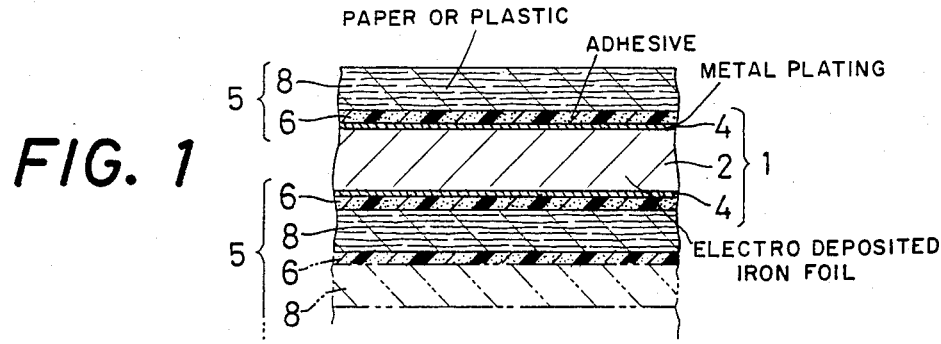
FIG. 1 is a sectional view of an example of the essential structure of the composite sheet material according to this invention.

A composite sheet metal 1, in FIG. 1, is composed of an electrodeposited iron foil 2 with a thickness of approximately 20 μm, and plating layers 4, 4 formed respectively on either side surface of the iron foil 1. The plating layers 4, 4 are respectively formed, through the electro-plating method, of a predetermined metal such as zinc, tin, nickel, chromium, copper, etc., up to as thick as about 1 μm.

On both sides of the composite sheet metal (FIGS. 1–2), an adhesive layer 6 made of an ordinary adhesive agent such as polyethylene is laid. The adhesive layer 6 and a predetermined sheet material 8, of for example paper, plastic film or sheet, which is adhesively laminated on the plating layer 4 form, a covering layer 5.

In this manner, the covering layer 5 is formed on both sides of the composite sheet metal 1 to sandwich it therebetween. Layer 5 may sometimes, depending on the application of the composite sheet, be formed only on one side of the composite sheet metal 1. Depending on the sheet material 8, the covering layer 5 may be varied in its kind, thickness and configuration (structure). It is also possible to form a covering layer 5 of a plurality of laminations, as described above and illustrated in FIG. 1 with two-dot chain line, that is, plural sheet materials 8 are, by way of the adhesive layer 6, adhesively laminated on the plating layer 4.

Figure 2:
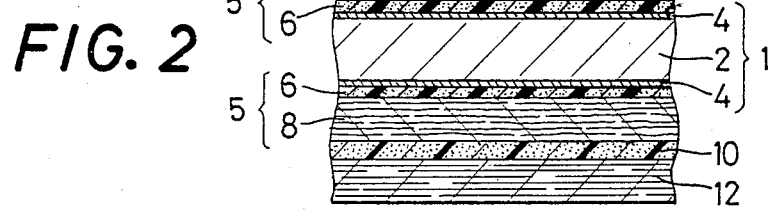
FIGS. 2-8 are respectively sectional views of other examples of the essential structure of the composite sheet material according to this invention.

Another composite sheet shown in FIG. 2, with covering layers 5, 5 formed on both sides, is provided only on one side with a pressure sensitive adhesive layer 10, which is known in application in adhesive tapes and the like, and further with a release liner 12 such as released paper stuck thereon.

Figure 3:
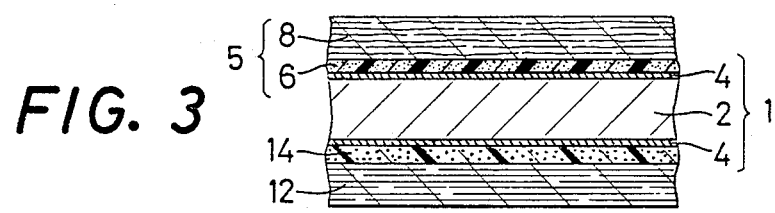

In still another composite sheet shown in FIG. 3, the covering layer 5 is formed only on one side surface of the composite sheet metal 1. On the other side surface thereof composite sheet metal 1, a good electric conductive pressure sensitive adhesive layer 14, having therein mixed electro-conductive metal powder grains, flakes or fibers such as of copper or aluminum, is formed and further thereon a release liner 12 is stuck.

The composite sheets in FIGS. 2 and 3 are both applicable to a desired place or location, upon stripping off their release liner 12, for exposing the pressure sensitive adhesive layers 10, 14. They can be thereby easily fixed to a desired place with the aid of the adhesive layers 10, 14, and characteristics of the composite sheet is herewith satisfactorily realized. The pressure sensitive adhesive layer 14 in the composite sheet of FIG. 3 is given electroconductivity through the mixing of metal materials, which will allow the composite sheet metal 1 to be advantageously electroconductive to the other matter which is stuck thereon by way of the adhesive layer 14.

Figure 4:
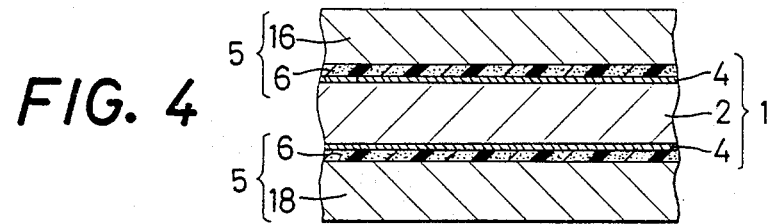

In this invention, as a sheet material 8 constituting the covering layer 5 which is formed at least on one side surface of the composite sheet metal 1, a metal foil or film, or a metal sheet or plate can be utilized. One example thereof is shown in FIG. 4 wherein a covering layer 5 composed of a heat-activatable adhesive layer 6 made for example of polyethylene, and a metal layer 16 made of copper foil adhesively laminated thereon is laid on one side surface of the composite sheet metal 1; and another covering layer 5 composed of a similar adhesive layer 6 and a metal layer 18 made of aluminum foil adhesively laminated thereon is formed on the other side surface of the composite sheet metal 1. In such a structure both the features of the composite sheet metal 1 and those of the metal layer 16, 18 function together, which makes it possible to produce far more effective shielding materials against electromagnetic waves and magnetism. When the metal layer 16, 18 is made of lead, the obtained composite sheet will additionally acquire shielding effect against radiation.

Although on either side surface of the sheet metal 1, placed on the center, the covering layers 5, 5 are formed in this embodiment, it is of course possible to reverse this structure, that is to say, on either side surface of the covering layer 5, placed in the center, sheet metals 1, 1 are disposed. Still another structure, wherein a plurality of sheet metals 1 and covering layers 5 are laminated alternatively is also permissible.

Such a shielding material in this invention, composed of the covering layer 5 including the metal layers 16, 18 and the sheet metal 1 which are united into a single lamination body, is mainly used for shielding electromagnetic waves and magnetism emitted inside the electronic equipment by the same from going outside. For example, it is used, by sticking it on the rear side of a switch box, for shielding the electromagnetic waves therefrom. By being stuck on the inside or outside of a case for electronic equipment, it shields the electromagnetic waves and magnetism generated inside the equipment for preventing them from outward emission, beside the shielding of the magnetism and electromagnetism from a magnetic head or a motor at their very source.

As for how to use or employ such shielding materials, there are a variety of ways. One is, as exemplified in FIG. 2 and FIG. 3, to coat an adhesive agent on the surface of the outer side metal layer 16 or 18 and further stick releasable paper thereon. Another is to put a two sided adhesive tape on the shielding material before suitably forming or punching it according to the use, and to stick it onto the desired place with the adhesive agent, leaving the outer side of the metal layer 16 or 18 untreated. It is possible in this way to shield the source of electromagnetic waves and magnetism and to make a metal plate or a metal foil, as a strong magnetic substance, the sheet metal 1 in this instance.

Figure 5:
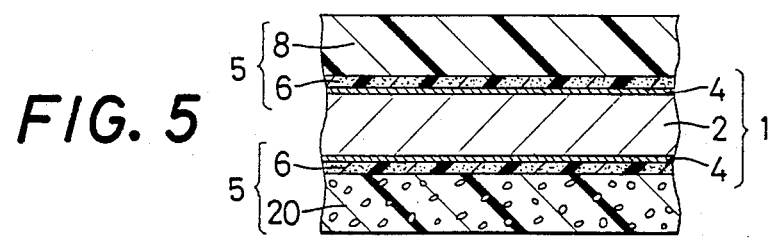

In another embodiment of the composite sheet according to this invention, shown in FIG. 5, as the sheet material constituting the covering layer 5 formed on one side surface of the sheet metal 1, a flame retardant plastic sheet 8 made of flame retardant polyester, etc. is used, and as the sheet material constituting the covering layer 5 on the other side surface thereof, a flame retardant foamed plastic sheet 20 is used.

Although the composite sheet in FIG. 5 can be similarly used as that in FIG. 4 it has further merit because of the shock absorbing function of the foamed sheet 20. It can namely protect the article or parts, to which the composite sheet is applied, from possible damage caused by shock. The covering layers 5, 5 are both made of flame retardant matters, i.e. flame retardant plastic sheet or flame retardant foamed plastic sheet, therefore, even when such a composite sheet is used inside some equipments it can well resist the heat or flame possibly generated within the equipments.

Figure 6:
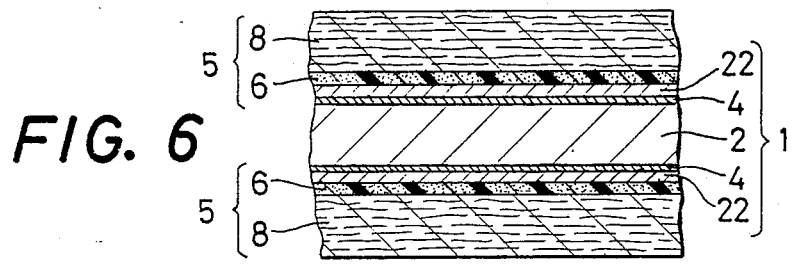
Figure 7:
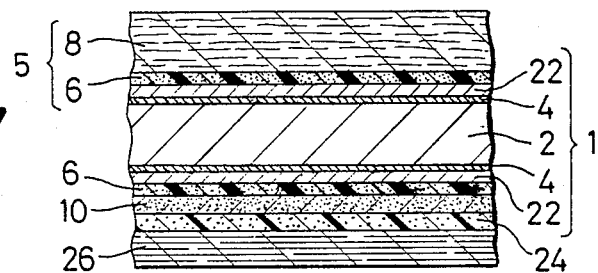
Figure 8:
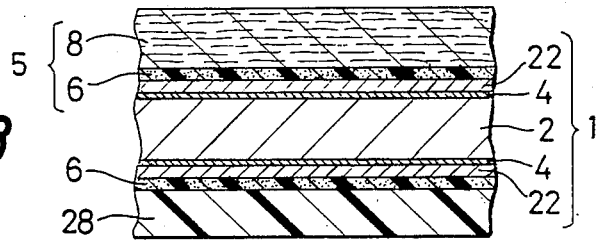

In FIGS. 6–8 some other composite sheets according to this invention, which have radiation shielding effect as well as magnetic and electronic shielding effect, are illustrated.

In the embodiment shown in FIG. 6, on either side surface of the electrodeposited iron foil 2 a nickel plating layer 4, 4 is respectively formed, and further thereon a lead plating layer 22, 22 of 20–100 μm is formed so as to complete the composite sheet metal 1. On either side surface of this sheet metal 1 an adhesive layer 6, 6 made of polyethylene, etc. is formed. Through the medium of the adhesive layer 6, 6, sheet material 8, 8, made of wooden sheet, asbestos sheet, glass fiber sheet, various woven stuffs or knitted stuffs is adhesively laminated so as to obtain a radiation shielding sheet according to this invention.

This kind of radiation shielding sheet, when for example woven or knitted stuff is used as the sheet-like material 8, 8, can be made into a radiation shielding hood (or skullcap). If a worker uses it in a workshop under a low level radiation, ingressing of the radiation into his/her head can be prevented. When a thin iron plate is used as a sheet-like material 8, 8, and it is shaped such as a whole channel and fitted on a conduit of polluted water by radio activity for being used for the purpose of shielding the radiactivity along with a lid therefor, radiation from the contaminated water can be prevented by a radiation shielding layer 22, 22 from ingression into the environmental ground, etc., that is the prevention of the radioactivity pollution.

FIG. 7 shows another embodiment of this invention, wherein on the adhesive layer 6 of the radiation shielding sheet shown in FIG. 6 an adhesive agent is applied in place of the sheet-like material so as to form a pressure sensitive adhesive layer 10, and thereon a released paper 26 applied a release agent is stuck to produce another completed radiation shielding sheet. If wallpaper or wall-decorative material is used as the sheet-like material, and this sheet is stuck onto the surface of a wall with its adhesive agent layer 10, after the released paper has been taken away, it would be very effective as wallpaper for a room, for example in a hospital, wherein radiation must be shielded.

The embodiment shown in FIG. 8 is another modification of the embodiment in FIG. 6. On one adhesive layer 6 of the radiation shielding sheet in FIG. 6, a fluoride resin film is struck or fluoride resin is coated so as to form a fluoride resin layer 28 for producing another radiation shielding sheet. In this kind of radiation shielding sheet, fluoride resin layer 28 is effective in protection of ultraviolet ray, insulation of electricity, and in reflection of electric waves. This sheet may be effectively utilized as building material, when wood is used as sheet-like material 8 and the fluoride resin layer 28 is placed outward in the actual use, because the radiation shielding layer 22 prevents radiation ingressing and the fluoride resin layer 28 is weatherproof.

The embodiments in FIGS. 6–8 adopted multiplating layers, that is to say, lead plating layer 22 was applied on the nickel plating layer 4. However, it is also possible to utilize a composite sheet metal 1 which has a lead plating layer 22 alone on the iron foil 2.

It is also permissible to form a packaging material of corrugated fiber board structure by utilizing the composite sheet according to this invention as one constituting element. In other words, by utilizing the composite sheet in this invention as the corrugated medium or intermediate liner in the corrugated fiber board, the obtained products are enhanced in their strength and foldability. The products can thereby be very useful as packaging material, supported by their excellent magnetic and electronic shielding effect.

Figure 9:
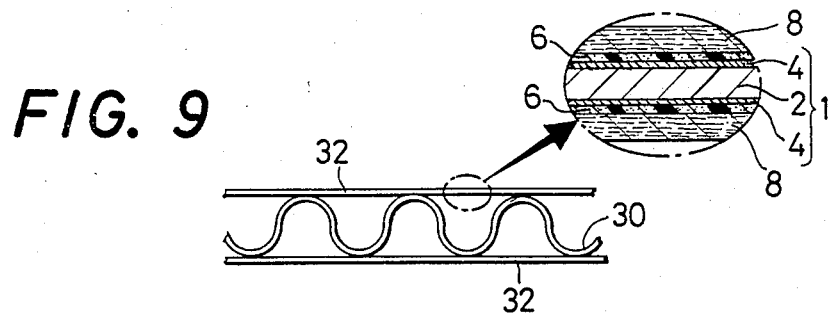
FIG. 9 is a sectional view of an example of the essential structure of the corrugated packaging material.

FIG. 9 shows an example of such a composite corrugated packaging material, which is a corrugated fiber board of the simplest structure composed of a layer constituted of a corrugated medium 30 and a pair of liner layers made of liners 32, 32 situated on either side of the layer for being stuck on the corrugated medium 30 with a suitable adhesive agent. One of the liners 32, upper side in the figure, is constituted of a composite sheet illustrated in FIG. 1. This kind of composite sheet is of compound structure, wherein a sheet metal 1 which is an iron foil 2 plated with nickel 4 on either side thereof is sandwiched by kraft paper 8, 8 through the medium of an adhesive layer 6, 6.

In the above example only one liner of the corrugated fiberboard is being replaced by the invented composite sheet. There may be, however, some more variations for the corrugated fiberboard. Both liners can be formed of the invented composite sheet; the corrugated medium alone can be replaced by the invented composite sheet; all of the corrugated medium and liners may be formed by the composite sheet. It goes without saying that this composite sheet can be applied to a corrugated fiberboard of compound structure wherein a plurality of corrugated medium layers 5 are laminated through the medium of liners.

The composite sheet material and the corrugated packaging material with an essential structure according to this invention, have been described above in detail. With those materials however, various products can be made as undermentioned. This invention of course includes all of those products.

Figure 10:
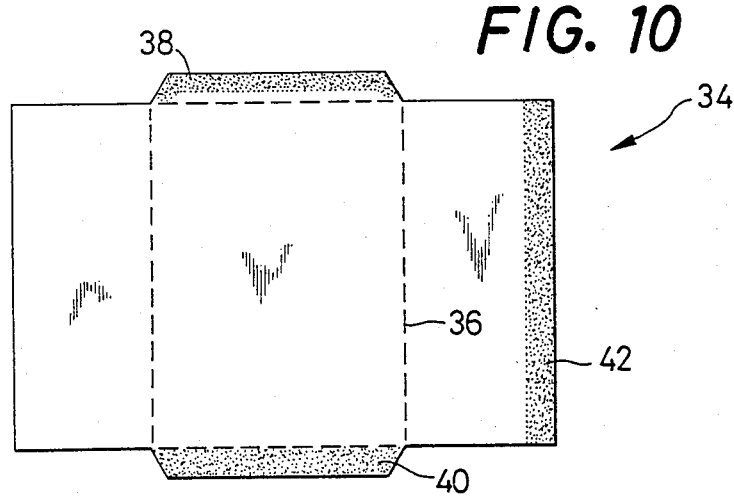
FIGS. 10 and 12 are plan views of envelopes according to this invention.

In FIG. 10 an envelope 34 according to this invention is shown unfolded as a plan view. Such an envelope is formed of a composite sheet material in FIG. 1 or a composite corrugated packaging material in FIG. 9, which has been pressed to rectangular shape with a die and punched into the envelope configuration. In the figure the broken lines show die-pressed lines 36, and the densely dotted areas are respectively a margin for pasting.

In this case, when compound corrugated cardboard is adopted as its material, arrangement of corrugation is preferable for an envelope made by twice-folding to be perpendicular to the direction of folding from the consideration of envelope's strength. When a corrugated packaging material illustrated in FIG. 9 is utilized, it is preferable to place the liner of the composite sheet outside the finished envelope. It is recommendable again, for the purpose of further shock mitigation in the course of transportation, to stick a cushioning layer of foamed plastic or multi-cellular sheet onto the envelope inside, i.e., the whole area in FIG. 10 except the densely dotted areas.

Figure 11:
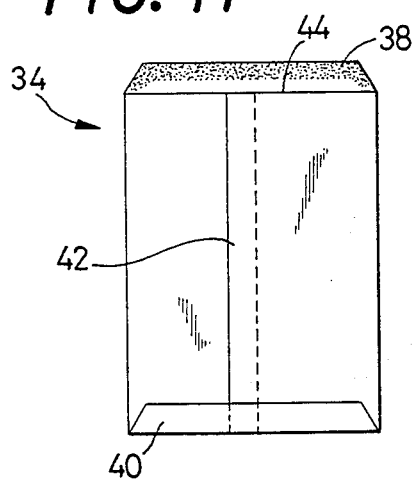
FIGS. 11 and 13 are rear views of the envelopes shown in FIG. 10 and 12, respectively.
Figure 12:
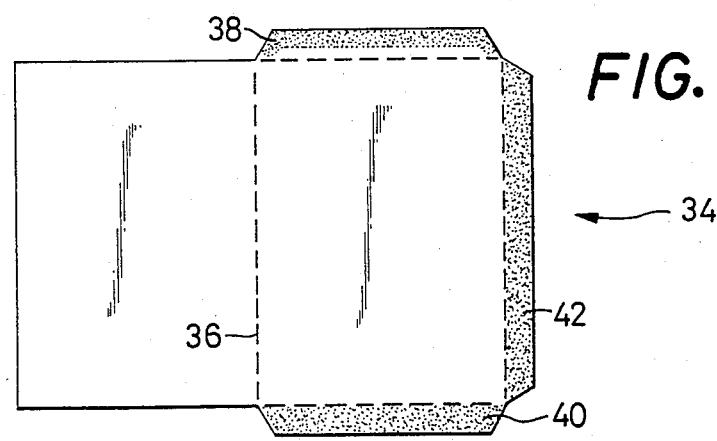

When the material for the envelope, shown unfolded in a plan view in FIG. 10, is inwardly folded from either side along the die-pressed lines 36 so as to finish, it becomes a complete envelope shown in FIG. 11, leaving an opening 44 open. In FIG. 11 an ordinary envelope for post-mailing is illustrated, however, configuration of envelopes may be varied according to the shape and dimension of the contents, such as information recording media and electronic parts, to be transported. One varied example is shown in FIG. 12 as an unfolded plan view. Numerals and signs in the figure correspond to those in FIG. 10.

Figure 13:
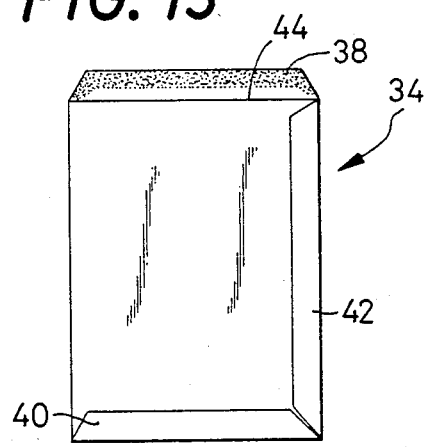
Figure 14:
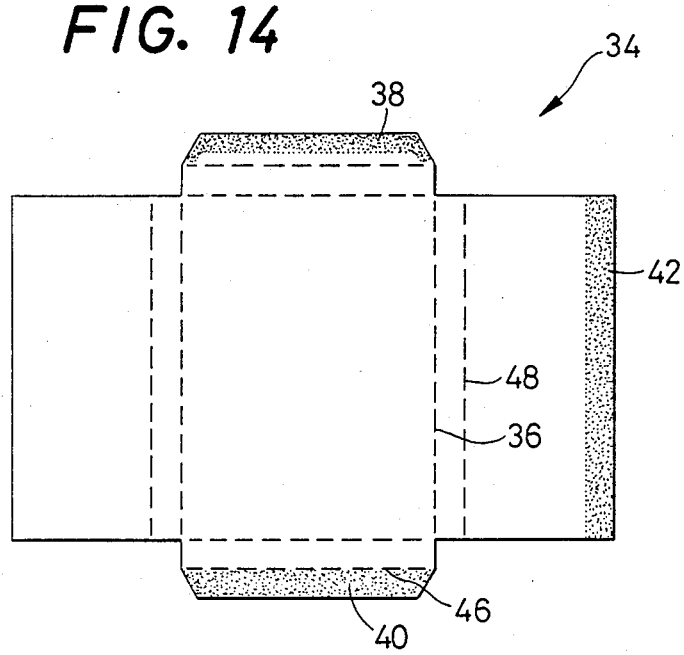
FIGS. 14 and 15 are respectively plan views of an envelope for accommodating contents with some substantial thickness.
Figure 15:
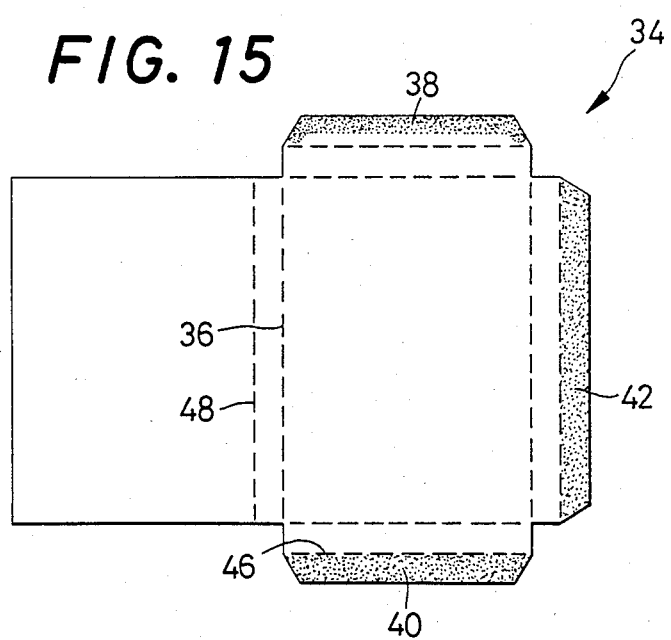

FIG. 13 shows a finished envelope, which has been formed by folding the material shown in FIG. 12 inwardly from each side along the die-pressed broken lines 36 leaving only an opening 44. For the transportation of matters with some substantial thickness such as audio-tapes or cassette-tapes, die-pressed lines in the envelope must be respectively made double with additional lines 46, 48 as shown in FIGS. 14 and 15, in place of the single line in FIGS. 10 and 12.

Enclosing in an envelope a tape together with a spacer, made of foam plastics having a recess slightly larger than the tape in which the tape should be placed, is recommendable when it is transported, for the sake of safety protection from shocks.

Among the information recording mediums, magnetic discs such as floppy discs, video discs, etc., and magnetic tapes such as audio-tapes, video-tapes, etc., further electronic parts such as IC are all susceptible to damage from static electricity. When they are transported, however, in an invented envelope the ferro-metal foil, which is a good electric conductor, disperses the static electricity. It means that the invented envelopes contribute at the same time to shielding from the static electricity.

Furthermore, closing of the envelope with metallic staples having strong magnetism, beside starch pasting, will ground various static electricity possibly arise during the transportation, by virtue of the staples. The invented envelopes thus can be said very safe and useful because of shielding the contents from static electricity.

Figure 16:
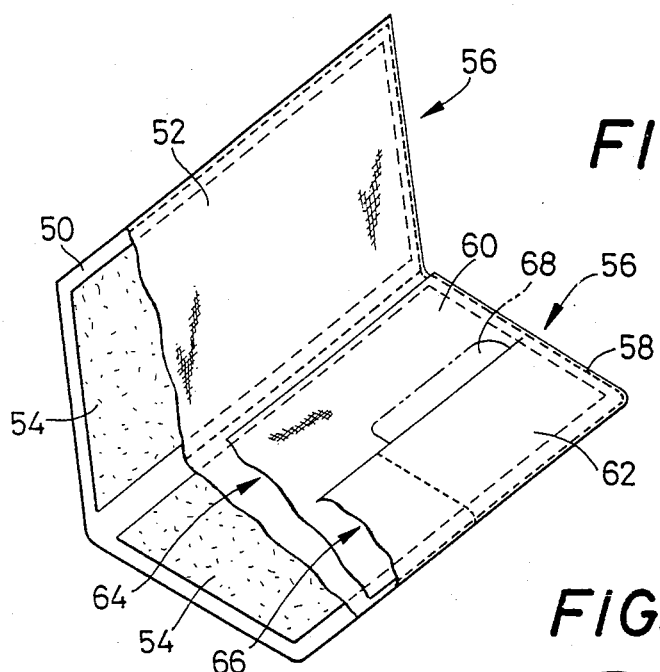
FIGS. 16, 17 and 18 are perspective views, partially cut away, of a magnetic-card holder and a magnetic-card protection case.
Figure 17:
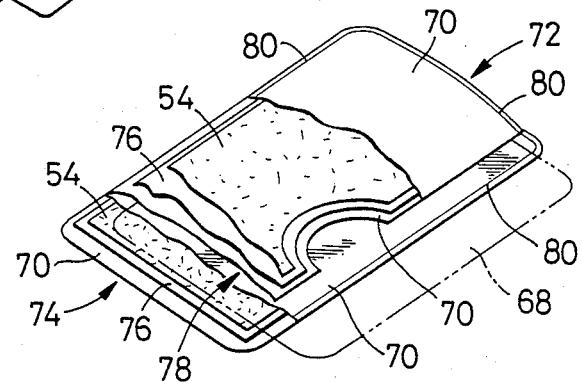
Figure 18:
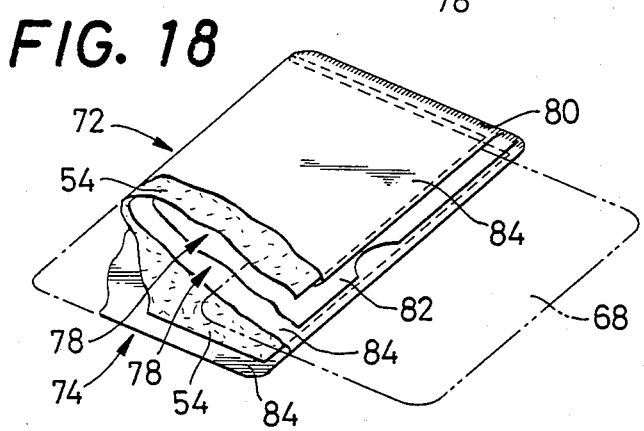

In FIGS. 16–18 various magnetic-card holders are illustrated, wherein the composite sheet(s) is disposed in the cover body or the wall body which are formed by superposing their constituting materials.

FIG. 16 shows a double-foldable magnetic-card holder which also serves as a wallet. A rectangular front leather 50 and a rectangular rear leather 52 of almost the same size are sewed up together at their peripheral portion into a bag shape for being inserted between that double wall structure a magnetic shielding plate 54, 54 made of the composite sheet according to this invention, for example one illustrated in FIG. 1. It should be used, as illustrated, by folding it into two. In other words, the superposed front leather 50 and rear leather 52 are double folded together to form two of the cover body 56, 56, and the magnetic shielding plate 54 is so disposed inside the cover body 56 as to occupy the substantial part of the plane size, namely the size of the plate is slightly less than that of the cover body 56. Numeral 58 designates a seam line.

Moreover, on the inner side of the cover body 56, i.e., on the rear leather 52, dividing sheets 60, 62 are respectively superposed, such that three sides thereof are sewed up for respectively forming a bill-pocket 64 and a magnetic-card receiving pocket 66.

Therefore, any magnetic-card 68 such as cash card or plastic money, credit card, ID card, etc. accommodated in such a way into the magnetic-card receiving pocket 66 can be sandwiched, by the magnetic shielding plate 54, 54 from either direction, by means of twice folding the double-foldable magnetic-card holder. In this card holder magnetic noise from outside can be effectively shielded.

A magnetic-card protection case in FIG. 17 is formed of a front wall 72 and a rear wall 74, respectively made of a plastic sheet 70, into a bag-like shape. Inside each of the front wall 72 and rear wall 74, a magnetic shielding plate 54, with a size slightly smaller than the plane of those walls, is accommodated in a reinforced state by a ground board 76 made of carboard, since both the front wall 72 and rear wall 74 are fused together by heat along the peripheral portion of the superposed rectangule to form a sealed card containing space 78. Numeral 80 designates a heat-sealing line.

The magnetic-card 68 accommodated in this magnetic-card protection case shown in FIG. 17 is also similarly protected, since the card containing space 78, is due to the magnetic shielding plate 54 in the front wall 72 and that of the rear wall 74. Even when the magnetic-card protection case is exposed to magnetic force line, the card can not be affected.

A magnetic-card protection case in FIG. 18 is characterized, different from that in FIG. 17, in that one magnetic shielding plate 54 is disposed integrally extending from the front wall 72 to the rear wall 74 by double folding it. Between the front wall 72 and the rear wall 74 a dividing sheet 82 is disposed so as to form a couple of magnetic-card containing spaces 78, 78. Both the front wall 72 and the rear wall 74 are formed by means of bending two-fold two superposed plastic films 84, and either side edge of the superposed films is sealed with heat to finish the case. The same shielding effect on the magnetic-card accommodated in this case can be expected as in the previous embodiment.

It is also possible to prepare a composite card by means of sandwiching a magnetic shielding plate of a suitable size for example approximately same size as the magnetic card 68, from either side by suitable plastic sheet or film, and sealing the superposed peripheral portion of the sheet or film. With one or two of this kind of composite card, containing a magnetic shielding plate therein, shielding of a magnetic-card can handily be performed. When a magnetic-card is put in a wallet or the like together with this composite card, one on top of the other, influence of magnetic force at least from one direction can be shielded. If the magnetic-card is sandwiched by two composite cards of this type, adverse effect of magnetic force from either direction can of course be shielded. It is also possible to connect one side of the two composite cards to make a structure such as the two-fold one in FIG. 16, or as the case in FIGS. 17 and 18.

Embodiments in FIGS. 16, 17 and 18, and the description related thereto were focused on the magnetic-card as the object, however, structure and application thereof can be expanded considerably wide by means of altering the size of the magnetic shielding plate 54, the card containing space 78, or reconsidering the size and location of the card receiving pocket 66. They can be applied, for example, to other protection cases or accommodating spaces for other magnetic recording media such as floppy disc and laser disc.

In FIGS. 19 and 20 magnetically shielded files for accommodating magnetic recording media are illustrated according to this invention.

Numeral 90 designates a file, wherein two principal walls 92, 94, with a backbone 96 situated in the middle, are connected to be integral. Numerals 78 and 100 designate, respectively, an accommodation body and a lid body, both being slightly smaller in their outline than the principal walls 92, 94, and being stuck thereon with adhesive agent or the like. When the file 90 is closed, the accommodation body 98 is completely covered by the lid body 100.

The accommodation body 98 and the lid body 100 are formed with, for example, the undermentioned materials so as to be able to absorb magnetic force and electromagnetic waves by themselves.

With a composite sheet material, which is made of a composite sheet metal 1 exemplified in FIG. 1 by forming on one or both side surfaces a covering layer 5, the accommodation body 98 and the lid body 100 of box shape, low in height and void of the ceiling, are formed. When the accommodation body 98 and the lid body 100 are stuck at their respective bottom surface onto the inside surface of the principal walls 92, 94 the file 90 having the function of magnetic and electronic shielding is completed. Numeral 102 designates a metal fitting disposed in the accommodation body 98 for filing or binding papers or the like.

Although the accommodation body 98 and the lid body 100 are, in the above-mentioned embodiment, made of the composite sheet material, for being stuck onto the inside surface of the principal walls 92, 94, another way of forming the file 90 is also permissible, that is to say, to make the principal walls 92, 94 first from the composite sheet material, and fix thereafter a couple of frame body of the composite sheet material by, for example, sticking respectively onto the inside surface of the principal walls 92, 94. The accommodation body 98 and the lid body 100 are thus respectively formed of the frame body and the principal wall. The metal fitting 102 for the binding may be disposed when it is needed. It is also permissible, if necessary, to form or fit a case or something in the accommodation body 98 for holding a cassette tape(s) therein.

A magnetic and electromagnetic wave shielding file constructed in the above-mentioned way, even when some matters susceptible to magnetism and electromagnetic waves such as floppy discs, cassette tapes, etc. are put therein, are not affected by the magnetism and the electromagnetic waves, because the accommodation body 98 is completely covered by the lid body 100 by closing of the file 90. If the file 90 is exposed to the magnetism or the electromagnetic waves, the accommodation body 98 and the lid body 100 containing the electrodeposited iron foil 2 therein absorb the magnetism and the electromagnetic waves and perfectly prevent them from reaching the matters therein held.

In FIGS. 21 and 22 an electromagnetic wave shielding box, as an embodiment of this invention, is illustrated. A box 104 according to this invention of rectangular hexahedron structure shown in FIG. 21 is composed of an accommodation body 106 and a lid body 108 of a plate style, an opening at the top of the former accommodation body 106 being covered by the latter lid body 108 which is connected with the former at a longer side of the rectangular opening of the accommodation body 106. Both the former and the latter are respectively made of a plate-type material which is formed of a basic material 110 of thicker paper-board having on either side surface thereof a stuck shielding sheet 112. This shielding sheet 112 is constituted of any one of the composite sheet materials like those illustrated in FIGS. 1–9.

Another box 114 shown in FIG. 22 is composed of an accommodation body 116 and a separated cover body 118, both the former and the latter being made of a basic material 110 of wooden plate. On the inside wooden surface of the former and the latter the above-mentioned shielding sheet 112 is respectively stuck all over.

Articles susceptible to magnetism and electromagnetic waves accommodated in those boxes 104, 114 can be shielded, when exposed to magnetism and electromagnetic waves, from the deleterious effects. Since the iron foil of the composite sheet material in the shielding 110 has the capability of absorbing such magnetism and electromagnetic waves.

From this ground it can be safely said that boxes of relatively small size are appropriate for accommodating relatively small size but very susceptible articles such as floppy discs, cassette tapes, etc., and that large size boxes made of wooden basic material 110, excellent in strength, can be preferably utilized as transporting means such as a container for computers and other related machines.

Figure 23:
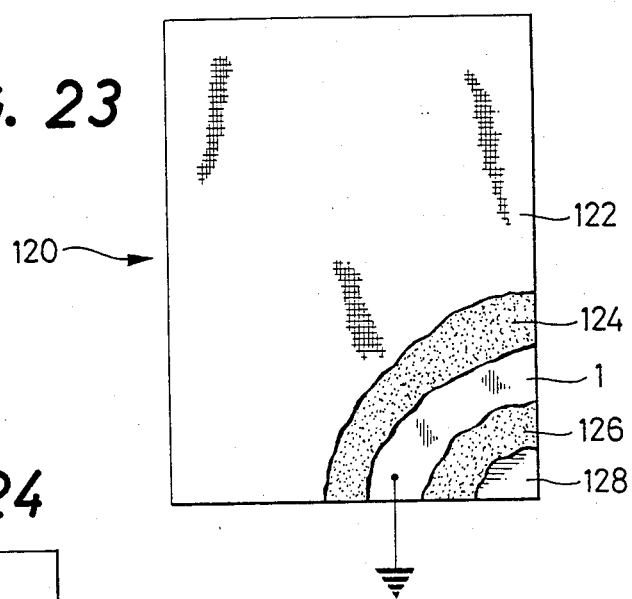
FIG. 23 is a partially cut away, view of wallpaper or wall-decorative material according to this invention.

FIG. 23 shows an example of wallpaper, as an embodiment according to this invention, which has magnetic and electronic shielding effect.

The wallpaper or wall-decorative material illustrated in FIG. 23 is formed such that a wallpaper substance 122 has on its rear side surface the above-mentioned composite sheet metal 1 stuck by way of an adhesive layer 124 and further on the rear side surface of the sheet metal 1 a sheet of back paper 128 is by way of another adhesive layer 126 stuck to complete the wallpaper. It is also possible, if necessary, to form on the rear side surface of the backpaper 128 a pressure sensitive adhesive layer, like the illustration in FIGS. 2 and 3, which is covered thereon by a release liner.

Such wallpaper in this invention is, when used, stuck onto the surface of a room wall or a room divider (partition). Walls provided with such wallpaper, when exposed to electromagnetic waves either on front or rear side, are able to shield computers, television sets and so on installed in the room from the influence of the electromagnetic waves because the composite sheet metal 1 contained in the wallpaper absorbs it well. On the contrary, electromagnetic waves which may possibly be emitted by the computers or other matters in the room can be absorbed by the wallpaper, with an advantageous result of preventing the bad influence thereof from going outside the room.

Incidentally, the wallpaper 120 applied in this way onto the room wall is desirable to be electrically grounded, when used.

Figure 24:
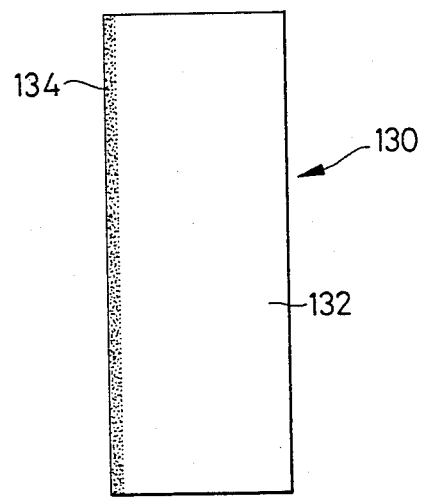
FIG. 24 is an elevational view showing an example of the cover for electrical wire according to this invention.
Figure 25:
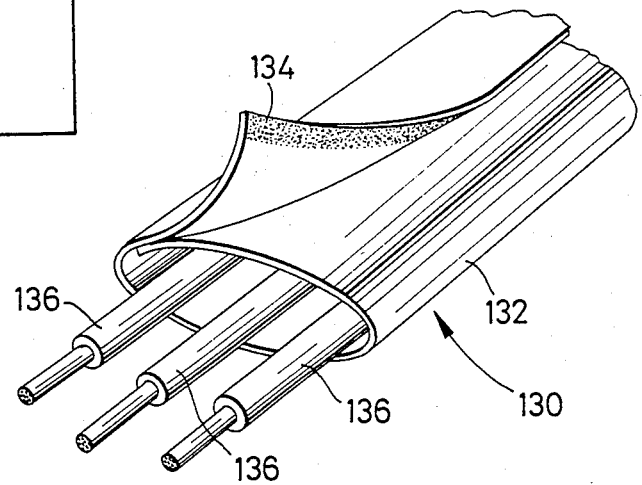
FIG. 25 is a perspective view showing the wire cover of FIG. 24 in wire-covering use.

An example of a wire cover, as an embodiment of present invention, is illustrated in FIGS. 24 and 25. The wire cover 130, as can be seen in the drawing, is composed of the above described composite sheet material, which is constituted of a shielding sheet 132 illustrated in FIG. 1, and an adhesive layer 134 attached with a predetermined width on the end portion of the shielding sheet 132. The adhesive layer 134 is particularly desirable to be a pressure sensitive adhesive layer, and a release liner may be attached on the adhesive layer in case of necessity.

A wire cover 130 of this sort may be used, as shown in FIG. 25, by winding about or wrapping up one or several predetermined wires 136. Covering of wires in this manner can shield the wire 136 from electromagnetic waves coming from outside, and at the same time prevent or shield the electromagnetic waves which the wire 136 itself may possibly emit from going outside.

In the above example the adhesive layer is formed on the surface of the shielding sheet 132, being limited to a strip-like predetermined area. It is however permissible to form the same on all over one side surface of the shielding sheet 132. In other words it is also allowed to use the composite sheet material shown in FIGS. 4 and 5 as a wire cover, as it is. As for the way of use of this wire cover, forming the same into a long strip style beforehand, and winding it about the aimed wire spirally is another practicable answer.

It is possible again to get an electrical conductor assembly, having the same function as the above described wire cover, by making good use of the composite sheet metal, which is made by forming a plating layer on either side surface of the electrodeposited iron foil often used in this invention. One example thereof is shown in FIGS. 26 and 27.

Figure 26:
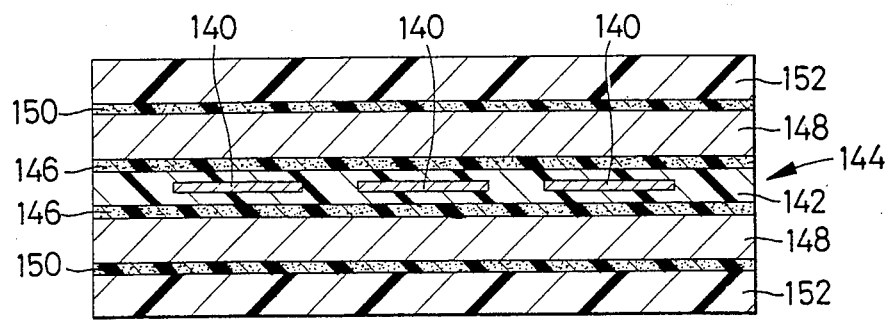
FIG. 26 is a sectional view showing an example of the electrical conductor assembly.
Figure 27:
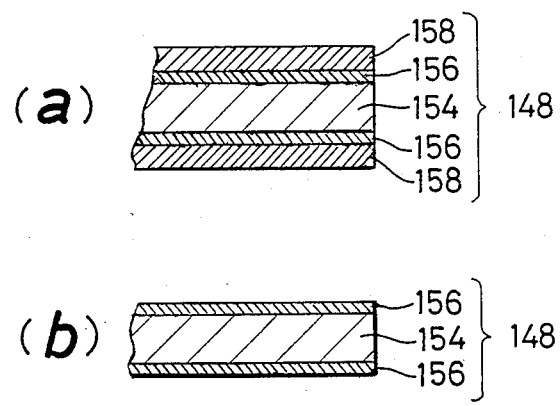
FIGS. 27(a) and 27(b) illustrate sectional partial views showing different examples of the composite sheet metal employed in the above-mentioned electrical conductor assembly.

Numeral 144 designates in FIG. 26 a plurality of mutually indepnedent good electric conductive and flattened members, being made of good electric conductive metal such as copper, aluminum, etc. This may be replaced by a bundle of ordinary electrical wires, furthermore, an insulation layer 142 constituted of synthetic resins or the like is so formed as to embrace (surround) the electric conductive member 140. All of these cooperate together for forming as a whole a flat plate-like current conductive body 144. On either side surface of this current conductive member 144 a composite sheet metal 148, which is formed by applying on either side surface of the electrodeposited iron foil a predetermined plating layer, is stuck through the medium of an adhesive layer 146, 146. Further on either outer side of the composite sheet metal 148 a covering layer 152 constituted of synthetic resins, etc., is stuck through the medium of an adhesive layer 150. In this way, by means of laminating on either side surface of the current conductive body 144 respectively the composite sheet metal 148 and the covering layer 152 to make all of these one united body, the aimed electrical conductor assembly is completed.

The current conductive body 144 in this embodiment is sandwiched from either side by the composite sheet metal 148, 148, as illustrated, so it is a matter of course that magnetism and electromagnetic waves directed to the current conductive body 144 from outside are all effectively shielded. Magnetism and electromagnetic waves generated in the current conductive body 144 are also shielded effectively from going outside.

The composite sheet material 148 in this example is preferable to be such that an electrodeposited iron foil 154 in the center is applied on either side surface thereof a first plating layer 156 formed of a good electric conductive metal such as nickel, zinc, tin, copper, chromium, etc., and a second plating layer 158 of lead formed on the first layer. It is however passable to form a single plating layer 156 as can be seen in FIG. 27(b).

The insulation layer 142 constituting the current conductive body 144 may be identical with the adhesive layer 146 for the purpose of sticking the composite sheet metal 148 onto the current conductive body 144. The covering layer 152 which is placed outermost should be made of a suitable material selected according to the use of the electrical conductor assembly. It is however preferable to be excellent in the insulation and weather-proof capability.

It is to be understood that other various changes and modifications may occur to those skilled in the art in the light of the foregoing technique, without departing from the scope of the invention defined in the appended claims.

What is claimed is:

1. A composite sheet material for magnetic and electronic shielding, comprising:
   a composite sheet metal including an electrodeposited iron foil with a thickness of at least 10 um and not more than 50 um, and a pair of metal plating layers on opposite surfaces of said electrodeposited iron foil, said metal plating layers being formed of a metal selected from the group consisting of zinc, tin, nickel, chromium, copper and lead; and
   a covering layer formed on at least one of said pair of metal plating layers of the composite sheet metal, said covering layer comprising at least one layer of sheet-like material which is bonded to a respective surface of the composite sheet metal with an adhesive layer interposed therebetween.

2. The composite sheet material of claim 1, wherein said metal plating layers have a thickness within a range of 0.1–5 $\mu$m.

3. The composite sheet material of claim 1, wherein said sheet-like material is selected from the group consisting of paper, plastic sheet, metallic foil or film, and metallic sheet.

4. A magnetic-card holder having two covering sheet members of rectangular shape superposed on each other and connected flexibly to each other at their edges along one corresponding side of the rectangle, at least one of the two covering sheet members having on its inner side a storage pocket for accommodating a magnetic card, wherein the improvement comprises:
   each of said two covering sheet members including a pair of walls defining a double-walled structure, and a composite sheet material comprising:
      a composite sheet metal including an electrodeposited iron foil with a thickness of at least 10 um and not more than 50 um, and a pair of metal plating layers on opposite surfaces of said electrodeposited iron foil, said metal plating layers being formed of a metal selected from the group consisting of zinc, tin, nickel, chromium, copper and lead,
   said composite sheet material being sandwiched between said pair of walls so as to cover a substantive part of the area of said covering sheet member.

5. A magnetic-card protection case for accommodating at least one magnetic card, including a front and a back flat wall member of rectangular shape superposed on each other and connected to each other at their edges along three sides of the rectangle, said front and back flat wall members being left unconnected at their edges along the remaining one side to provide an opening through which said magnetic card is inserted between the front and back flat wall members, wherein the improvement comprises:
   each of said front and back flat wall members including a pair of walls defining a double-walled structure, and a composite sheet material comprising a composite sheet metal including an electrodeposited iron foil with a thickness of at least 10 um and not more than 50 um, and a pair of metal plating layers on opposite surfaces of said electrodeposited iron foil, said metal plating layers being formed of a metal selected from the group consisting of zinc, tin, nickel, chromium, copper and lead, said composite sheet material being sandwiched between said pair of walls so as to cover a substantive part of the area of the respective flat wall member.

6. The magnetic-card protection case of claim 5, wherein each of said front and back flat wall members comprises a pair of plastic sheets which are fused together at their edges along the three sides, said composite sheet material being interposed between said pair of plastic sheets.

7. The magnetic-card protection case of claim 5, wherein said front and back flat wall members are formed of two superposed plastic sheets which are folded to provide the two pairs of walls constituting the front and back flat wall members, respectively, said composite sheet member being interposed between said two plastic sheets and folded together with the two plastic sheets so that the composite sheet material is sandwiched between the pair of walls of each of the wall members.

8. A shielding envelope of generally rectangular shape formed of a composite sheet material for accommodating at least one magnetic recording medium and/or at least one electronic component for storage and transportation thereof, said composite sheet material comprising a composite sheet metal including an electrodeposited iron foil with a thickness of at least 10 um and not more than 50 um, and a pair of metal plating layers on opposite surfaces of said electrodeposited iron foil, said metal plating layers being formed of a metal selected from the group consisting of zinc, tin, nickel, chromium, copper and lead.

9. A shielding housing of generally box structure for accommodating at least one magnetic recording medium and/or at least one electronic component for storage and transportation purpose, said housing comprising a storage box body having an opening, and a covering lid for closing said opening of the box body, said storage box body and said covering lid being made of a composite sheet material comprising a composite sheet metal including an electrodeposited iron foil with a thickness of at least 10 um and not more than 50 um, and a pair of metal plating layers on opposite surfaces of said electrodeposited iron foil, said metal plating layers being formed of a metal selected from the group consisting of zinc, tin, nickel, chromium, copper and lead.

10. A storage file formed of a composite sheet material for storing a magnetic recording medium, comprising a composite sheet metal including an electrodeposited iron foil with a thickness of at least 10 um and not more than 50 um, and a pair of metal plating layers on opposite surfaces of said electrodeposited iron foil, said metal plating layers being formed of a metal selected from the group consisting of zinc, tin, nickel, chromium, copper and lead.

11. A shielding material for magnetic and electronic shielding of electric wire(s), formed of a composite sheet material comprising a composite sheet metal including an electrodeposited iron foil with a thickness of at least 10 um and not more than 50 um, and a pair of metal plating layers on opposite surfaces of said electrodeposited iron foil, said metal plating layers being formed of a metal selected from the group consisting of zinc, tin, nickel, chromium, copper and lead.

12. A shielding material for magnetic and electronic shielding of electric wire, comprising a shielding sheet formed of a composite sheet material, comprising a composite sheet metal including an electrodeposited iron foil with a thickness of at least 10 um and not more than 50 um, and a pair of metal plating layers on opposite surfaces of said electrodeposited iron foil, said metal plating layers being formed of a metal selected from the group consisting of zinc, tin, nickel, chromium, copper and lead, said shielding sheet having at least at one end thereof a pressure sensitive adhesive layer of a predetermined width, said shielding sheet wrapping an electric wire such that said adhesive layer extends along the electric wire and is positioned over a portion of the shielding sheet for fixing said one end of the shielding sheet to said portion.

13. A wall-decorative material for magnetic and electronic shielding, consisting of a composite sheet material comprising a composite sheet metal including an electrodeposited iron foil with a thickness of at least 10 um and not more than 50 um, and a pair of metal plating layers on opposite surfaces of said electrodeposited iron foil, said metal plating layers being formed of a metal selected from the group consisting of zinc, tin, nickel, chromium, copper and lead.

14. An electrical conductor assembly for magnetic and electronic shielding, comprising:
 a plate-like electrical conductor body including a plurality of mutually independent electrical conducting members, and insulating layers sandwiching said conducting members;
 a composite sheet metal disposed on at least one side of said electrical conductor body comprising an electrodeposited iron foil having a thickness of at least 10 um and not more than 50 um, and a pair of metal plating layers on opposite surfaces of said electrodeposited iron foil, said metal plating layers being formed of a metal selected from the group consisting of zinc, tin, nickel, chromium, copper and lead; and
 a covering layer formed on at least one of said pair of metal plating layers of the composite sheet metal, said covering layer comprising at least one layer of sheet-like material which is bonded to the respective surface of the composite sheet metal with an adhesive layer interposed therebetween.

15. The electrical conductor assembly of claim 14, wherein said covering layer has electrical insulating property.

* * * * *